United States Patent
Iannuzzi et al.

(10) Patent No.: US 8,670,640 B2
(45) Date of Patent: Mar. 11, 2014

(54) OPTICAL FIBER, METHOD OF PREPARATION THEREOF AND DEVICE

(75) Inventors: Davide Iannuzzi, Hilversum (NL); Audrius Petrušis, Vilnius (LT); Jan Hendrik Rector, Amsterdam (NL)

(73) Assignee: Vereniging Voor Christelijk Hoger Onderwijs, Wetenschappelijk Onderzoek en Patientenzorg, Amsterdam (NL)

( * ) Notice: Subject to any disclaimer, the term of this patent is extended or adjusted under 35 U.S.C. 154(b) by 175 days.

(21) Appl. No.: 13/130,943

(22) PCT Filed: Nov. 19, 2009

(86) PCT No.: PCT/NL2009/050701
§ 371 (c)(1),
(2), (4) Date: Sep. 1, 2011

(87) PCT Pub. No.: WO2010/059050
PCT Pub. Date: May 27, 2010

(65) Prior Publication Data
US 2012/0014646 A1 Jan. 19, 2012

Related U.S. Application Data

(60) Provisional application No. 61/117,503, filed on Nov. 24, 2008.

(51) Int. Cl.
*G02B 6/42* (2006.01)
*G03F 1/00* (2012.01)
*G03F 7/20* (2006.01)

(52) U.S. Cl.
USPC .................... 385/37; 385/31; 430/5; 430/325

(58) Field of Classification Search
USPC .................... 385/31, 33, 37, 39; 430/5, 325
See application file for complete search history.

(56) References Cited

U.S. PATENT DOCUMENTS

| | | | | |
|---|---|---|---|---|
| 5,237,630 | A | * | 8/1993 | Hogg et al. ................. 385/12 |
| 6,200,737 | B1 | * | 3/2001 | Walt et al. .................. 430/320 |
| 7,127,810 | B2 | * | 10/2006 | Kasuga et al. ................. 29/833 |
| 2004/0067423 | A1 | * | 4/2004 | Chen et al. ........................ 430/5 |

FOREIGN PATENT DOCUMENTS

| | | |
|---|---|---|
| JP | 55073011 | 6/1980 |
| JP | 55134802 | 10/1980 |

OTHER PUBLICATIONS

Iannuzzi D. et al: "Monolithic fiber-top sensor for critical environments and standard applications", Applied Physics Letters 2006 American Institute of Physics Inc. US, vol. 88, No. 5, 2006, pp. 1-3, XP002565035, Figure 1.

(Continued)

*Primary Examiner* — Daniel Petkovsek
(74) *Attorney, Agent, or Firm* — Hoffmann & Baron, LLP (57) ABSTRACT

The invention provides an optical fiber, a method for the preparation thereof, and a device. An optical fiber, wherein a distal end of the optical fiber is provided with an optical mask adapted for projecting a predetermined pattern on a target surface by radiation transmitted from the distal end of the optical fiber, allows for the rapid application of patterns and three-dimensional structures on target surfaces, in particular on the ends of optical fibers.

15 Claims, 5 Drawing Sheets

(56) References Cited

OTHER PUBLICATIONS

Kelkar P.S. et al: "Nano patterning on optical fiber and laser diode facet with dry resist", Journal of Vacuum Science and Technology: Part A, AVS / AIP, Melville, NY, US, vol. 22, No. 3, May 1, 2004, pp. 743-746, XP012073637, ISSN: 0734-2101, p. 745, paragraph II; figure 1.

Foglietti V. et al: "Progress toward the fabrication of scanning near field optical probe: pattern definition bye-beam lithography", Microelectronic Engineering, Elsevier Publishers BV., Amsterdam, NL, vol. 57-58, Sep. 1, 2001, pp. 807-811, XP004302346, ISSN: 0167-9317, paragraph [0002]; figure 5.

Frohlich F.F. et al: "High-resolution optical lithography with a near-field scanning sub-wavelength aperture", Proceedings of the SPIE—The International Society for Optical Engineering USA., vol. 1751, 1993, pp. 312-320, XP002565034, ISSN: 0277-786X, p. 313; paragraph 3, figure 2.

\* cited by examiner

OPTICAL FIBER, METHOD OF PREPARATION THEREOF AND DEVICE

CROSS-REFERENCE TO RELATED APPLICATIONS

This application is the National Stage of International Application No. PCT/NL2009/050701, filed Nov. 19, 2009, which claims the benefit of U.S. Provisional Application No. 61/117,503, filed Nov. 24, 2008.

FIELD OF THE INVENTION

The invention provides an optical fiber, a method for the preparation thereof, and a device.

BACKGROUND OF THE INVENTION

The shaping of the cleaved end of an optical fiber has been previously described, e.g., in the form of micromachined focusing elements (M. Sasaki et al., Direct photolithography on optical fiber end, Jpn. J. Appl. Phys. 41, 4350-4355 (2002); P. N. Minh et al., Batch fabrication of microlens at the end of optical fiber using self-photolithography end etching technique, Opt. Rev. 10, 150-154 (2003); F. Schiappelli et al., Efficient fiber-to-waveguide coupling by a lens on the end of the optical fiber fabricated by focused ion beam milling, Microelectronic Eng. 73-74, 397-404 (2004); R. S. Taylor and C. Hnatovsky, Particle trapping in 3-D using a single fiber probe with an annular light distribution, Optics Express 11, 2775-2782 (2003); C. Liberale et al., Miniaturized all-fiber probe for three-dimensional optical trapping and manipulation, Nature Photonics 1, 723-727 (2007).), optical antennas (E. J. Smithe, E. Cubucku, and F. Capasso, Optical properties of surface Plasmon resonances of coupled metallic nanorods, Optics Express 15, 7439-7447 (2007).) or movable mechanical structures (fiber-top technology, D. Iannuzzi et al., Monolithic fiber-top sensor for critical environment and standard applications, Appl. Phys. Lett. 88, 053501 (2006).). The possibility to shape the cleaved end of an optical fiber represents a fascinating opportunity for the development of new devices for a wide variety of applications, including photonics, optical trapping, biochemical sensing (D. Iannuzzi et al., A fiber-top hydrogen sensor, Sensors & Act. B121, 706-709 (2007).), and atomic force microscopy (D. Iannuzzi et al., Fiber-top atomic force microscope, Rev. Sci. Instr. 77, 106105 (2006).). Unfortunately, the advantages offered by those instruments may be hampered by the large costs of production, which can be due to the fact that, at present, there are no known versatile fabrication procedures for batch manufacturing of arbitrary micromachined parts on the facet of optical fibers.

Optical lithography is one of the most widespread micromachining processes in silicon based technologies such as integrated circuits and MicroElectroMechanical Systems (See for example G. T. A. Kovacs, Micromachined transducers sourcebook (McGraw-Hill, New York, 1998).). The application of this process for the fabrication of patterns on top of optical fibers requires a precise alignment of the lithography mask to the centre of the fiber, which is a too cumbersome operation if standard photolithography mask aligners are to be used. On the other hand, over the last decades, the need of quick and reliable optical fiber fusion splicing machines, triggered by the fast growth of the telecommunication industry, has pushed enormous progress in the development of opto-mechanical tools that align the cleaved ends of two opposite optical fibers. Most of commercially available optical fiber fusion splicing machine use simple image-based active fiber alignment techniques to bring the two ends of the fibers in contact automatically within a few seconds (A. D. Yablon, Optical fiber fusion splicing (Springer, Berlin, 2005).).

OBJECT AND SUMMARY OF THE INVENTION

As a first exemplary procedure in the way to solve this problem, it is possible to provide an exemplary embodiment of a process and system which can facilitate a series production of arbitrary patterns on a photoresist layer deposited on the cleaved end of an optical fiber or other surfaces. Such exemplary system and method can utilize an align-and-shine photolithography procedure according to the invention. The align-and-shine photolithography technique is based on the idea to combine standard optical lithography with the opto-mechanical methods developed for optical fiber fusion splicing or similar automatic alignment processes.

The invention provides an optical fiber, wherein a distal end of the optical fiber is provided with an optical mask adapted for projecting a predetermined pattern on a target surface by radiation transmitted from the distal end of the optical fiber. Such a masked optical fiber having a specific pattern can be used to selectively irradiate a photoresist material deposited on a target surface, in particular the distal end of a target optical fiber. The optical fiber according to the invention enables to construct patterns or structures in a fast and convenient way. In particular, functional patterns or structures can be applied to surface of a target fiber, for instance optically functional elements or patterns, adding functionalities such as a collimator, diffractor, diffuser, filter or other patterns capable of influencing radiation such as visible light, that may be transmitted through the target fiber. The optical fiber according to the invention also allows for applying functional patterns or structures to other surfaces, for instance optical elements such as mirrors and filter surfaces. Preferably, the predetermined pattern has a resolution smaller than 100 nm, allowing to apply fine patterns to relatively small surfaces, which are necessary to obtain certain optical effects. Photoresist materials may be either positive or negative photoresist materials. Positive photoresist materials are characterised in that the portion of the photoresist exposed to irradiation (typically UV-light) becomes soluble to a solvent, and the exposed portion may be washed off afterwards. The portion of the photoresist that is unexposed to the irradiation remains insoluble to the solvent and remains on the target surface. A negative resist is a type of photoresist in which the portion of the photoresist that is exposed to irradiation becomes insoluble to the solvent (for instance by curing or crosslinking a polymer), whereas the unexposed portion may be washed off. Some well known photoresist materials are PMMA (polymethylmethacrylate), PMGI (PolyMethylGlutarimide), DNQ/Novolac (a phenol formaldehyde resin), and SU-8 (an epoxy-based negative photoresist).

In a preferred embodiment, the predetermined pattern is adapted for projecting at least part of a nanoantenna structure. A nanoantenna structure comprises at least one nanoantenna element, or preferably an array of nanoantenna elements protruding from a surface, which may be adapted, for example to serve as chemical sensors, in particular when the surface is chemically modified according to known techniques. Such nanoantennae may be used in analytical techniques, in particular to perform surface enhanced raman spectroscopy.

In another preferred embodiment, the predetermined pattern is adapted for projecting a Fresnel lens pattern. Such a lens may be used to focus or shape light at the exit of a patterned surface.

In yet another preferred embodiment, the predetermined pattern is adapted for projecting a wavelength grating pattern. A wavelength grating pattern causes diffraction in electromagnetic radiation of suitable wavelength.

In a further preferred embodiment, the predetermined pattern is adapted for projecting at least one layer of a three-dimensional structure or for projecting a protective layer in the construction of a three-dimensional layer. Such a predetermined pattern is adapted for applying a selective protective layer at a target surface in the layerwise construction of a three-dimensional structure. By layerwise construction, the optical fiber according to the invention enables the easy and rapid construction of three-dimensional structures from various materials. The protective layer made of a photoresist material enables the selective deposition of structural materials and/or selective protection of the underlying material from abrasive techniques such as plasma etching or reactive ion etching. The method according to the invention is particularly useful for rapidly applying selectively protective layers on the target fiber, after which the actual structural material layers such as silicon may be applied by conventional techniques for instance vapor-deposition techniques. The protective layer may be removed, for instance by a suitable chemical agent. For instance certain polymer materials such as PMMA may be removed by organic solvents such as acetone.

It is preferred if the optical mask is adapted for projecting a predetermined pattern on a target surface, the target surface being a distal end of a target optical fiber. Such a masked optical fiber enables the easy application of the predetermined pattern using a photoresist material on the distal end of the target optical fiber, for instance by selective radiation through the optical mask onto a positive or negative photoresist material, and subsequent removal of soluble material, leaving the predetermined pattern on the target surface. Distal end of optical fibers typically have a diameter in the range from a few mm to as small as the pm range, thus the pattern provided by the optical mask may be of similar proportions.

In a preferred embodiment, the optical mask is made out of a metallic material. Metallic materials provide a durable opaque mask having a good durability. Suitable metallic materials include silver, gold, chromium, titanium and alloys thereof, which may be applied by deposition methods including sputtering and thermal and ebeam evaporation techniques.

It is preferred if the optical fiber is adapted for transmitting radiation suitable for treating photoresist materials, preferably suitable for transmitting ultraviolet radiation. Multimode optical fibers are particularly suitable. Such radiation selectively treats portions of the photoresist material on a target surface irradiated through the optical mask according to the invention. Typical wavelengths for known treating photoresist material are in the blue and ultraviolet region of the electromagnetic spectrum, typically having a wavelength shorter than 500 nm.

The invention further provides a method for the preparation of an optical fiber according to the invention, comprising the process steps of providing a distal end of the fiber, and applying a mask material on the distal end of the fiber in a predetermined pattern to form an optical mask. The providing of the distal end may include cutting or otherwise treatment of the distal end to provide a regular, preferably flat perpendicular surface. The applying of the mask may include the application of mask material to the distal end of the fiber, and subsequently the selective removal of a part of the applied mask material according to the predetermined pattern, for instance by laser ablation and/or focussed ion beam milling.

The invention further provides a method for applying a predetermined pattern to a target surface, preferably the distal end of a target optical fiber, comprising the steps of:
providing a masked optical fiber, wherein a distal end of the masked optical fiber is provided with an optical mask having a predetermined pattern, application of a layer of photoresist material to at least part of the target surface, positioning the distal end of the optical fiber with respect to the part of the target surface provided with photoresist material, the application of suitable irradiation through the masked optical fiber to obtain the predetermined pattern in at least part of the photoresist material on the target surface, and the removal of redundant photoresist material. This method allows for a rapid, easy replication of the predetermined pattern on target surfaces. Preferably, the target surface is a distal end of a target optical fiber. The preferred patterns have an optical functionality.

The invention also provides an optical fiber obtainable by the method described above, wherein the distal end of the optical fiber is provided with a predetermined pattern made of a selectively irradiated photoresist material.

The method according to the invention is suitable for applying essentially two-dimensional structures to a surface. Such structures can usually be made using only one masked optical fiber. However, a further adaptation of the method according to the invention also provides a method for layerwise construction of a three dimensional structure on a target surface, wherein the steps according to claim 10 are repeated with the same or multiple different masked optical fibers having predetermined patterns adapted to form a predetermined three dimensional structure when the layers are stacked Optionally, the method according to the invention may be performed combining protective layers and structural layers with sacrificial material layers. Sacrificial layers are layers temporarily applied to support structural layers during the construction process, and are easily removed afterwards using a suitable chemical agent.

In a preferred embodiment, the method comprises the steps of growing and patterning alternate layers of sacrificial materials and structural materials on the target fiber. In this preferred embodiment, sacrificial (e.g., phosphosilicate glass, silicon dioxide, et cetera) and structural (e.g., silicon, silicon dioxide, silicon nitride) layers are alternatively deposited on top of the target fiber. Between one deposition and the following one, if necessary, it is possible to remove at least one part of the sacrificial or structural layer according, for example, to the following procedure: providing a first masked optical fiber, wherein a distal end of the optical fiber provided with a first optical mask having a first predetermined pattern, positioning the distal end of target optical fiber with respect to the part of the target surface, wherein the target surface is coated at least in part with at least a sacrifial or structural material layer covered with photoresist material, the application of suitable irradiation through the masked optical fiber to induce the predetermined pattern in the photoresist material on the target surface, the removal of redundant photoresist material to yield a first selectively protective photoresist layer; subsequently followed by the selective removal of the sacrificial or the structural material that is not protected by the patterned photoresist layer by means of, for example, plasma etching or reactive ion etching, and removal of the protective layer from the target surface to enable further layer construction steps. Complex three dimensional structures can be obtained by such a method, in a way similar to what is commonly already done in MicroElectroMechanical Systems technology. The method allows for rapid serial production of patterns or three dimensional elements on a surface, which offers excellent control of the thickness of structural and sacrificial layers, at a relatively high pattern resolution.

In a preferred embodiment the method is applied to the distal end of an optical fiber. The optical fiber obtainable by the method the invention has a distal end provided with a three-dimensional structure. The three-dimensional structure enables unusual functionalities, such as optomechanical transducers for biochemical sensors, chemical sensors, temperature sensors, humidity sensors and atomic force microscopy. For instance, the three-dimensional structure is a cantilever structure, which enables measurements of chemical and/or physical parameters (e.g., biochemical detection or chemical composition analysis, acceleration measurements, vibration measurements, force measurements, temperature measurements, humidity measurements, nanoscale imaging via atomic force microscopy, et cetera) with the distal end of an optical fiber.

The invention further provides a device for applying a predetermined pattern to a target surface, comprising at least one optical fiber having a distal end provided with an optical mask having a predetermined pattern, at least one source of radiation connected to the optical fiber for transmitting radiation towards the distal end of the optical fiber, and alignment means preferably an image-based alignment controller, for aligning the distal end of the optical fiber with respect to a target surface, preferably with respect to a distal end of a target optical fiber. Such a device would be capable of performing the method according to the invention to provide optical fibers with a predetermined pattern with optical or other functionality in a cost-effective and fast way. The device according to the invention could be partially based on known image-based fiber alignment devices for aligning optical fibers, by adding functionalities and programming the device to perform the method according to the invention. Parameters for alignment of the pattern, application of photoresist to the distal end of the target fiber, irradiating with appropriate light/irradiation for a sufficient time, and washing away the soluble material while retaining the predetermined pattern, are all steps not incorporated in known fiber-aligning machines.

In a more advanced embodiment, the device comprises multiple optical fibers having a distal end provided with an optical mask having a predetermined pattern, wherein the fibers have different predetermined patterns. Such a device would enable to construct three dimensional structures on a target fiber surface according to the invention as described above.

Accordingly, exemplary embodiments of the system and method for facilitating the series production of arbitrary photolithography patterns on optical fibers according to the present invention has been described herein above. It is within the scope of the present invention to use the exemplary principles described herein also for photo or thermoplastic nanoimprinting lithography (S. Y. Chou, P. R. Krauss, and P. J. Renstrom, Imprint of sub −25 nm vias and trenches in polymers, Appl. Phys. Lett. 67, 3114-3116 (1995); M. Colburn et al., Step and flash imprint lithography: a new approach to high-resolution patterning, Proc. SPIE 3676(1), 379-390 (1999); X. Cheng and L. J. Guo, A combined-nanoimprint-and-photolithography patterning technique, Microel. Eng. 71, 277-282 (2004), where a mold fiber (i.e., a fiber with a carved pattern on one of its cleaved ends) can be pressed against the target fiber, previously coated with a proper layer. The exemplary system and method which can utilize the align-and-shine photolithography procedures can provide an important opportunity for the future development of scientific and technological tools based on the possibility to suitably design the cleaved facet of an optical fiber.

DESCRIPTION OF PREFERRED EMBODIMENTS

Figure 1:
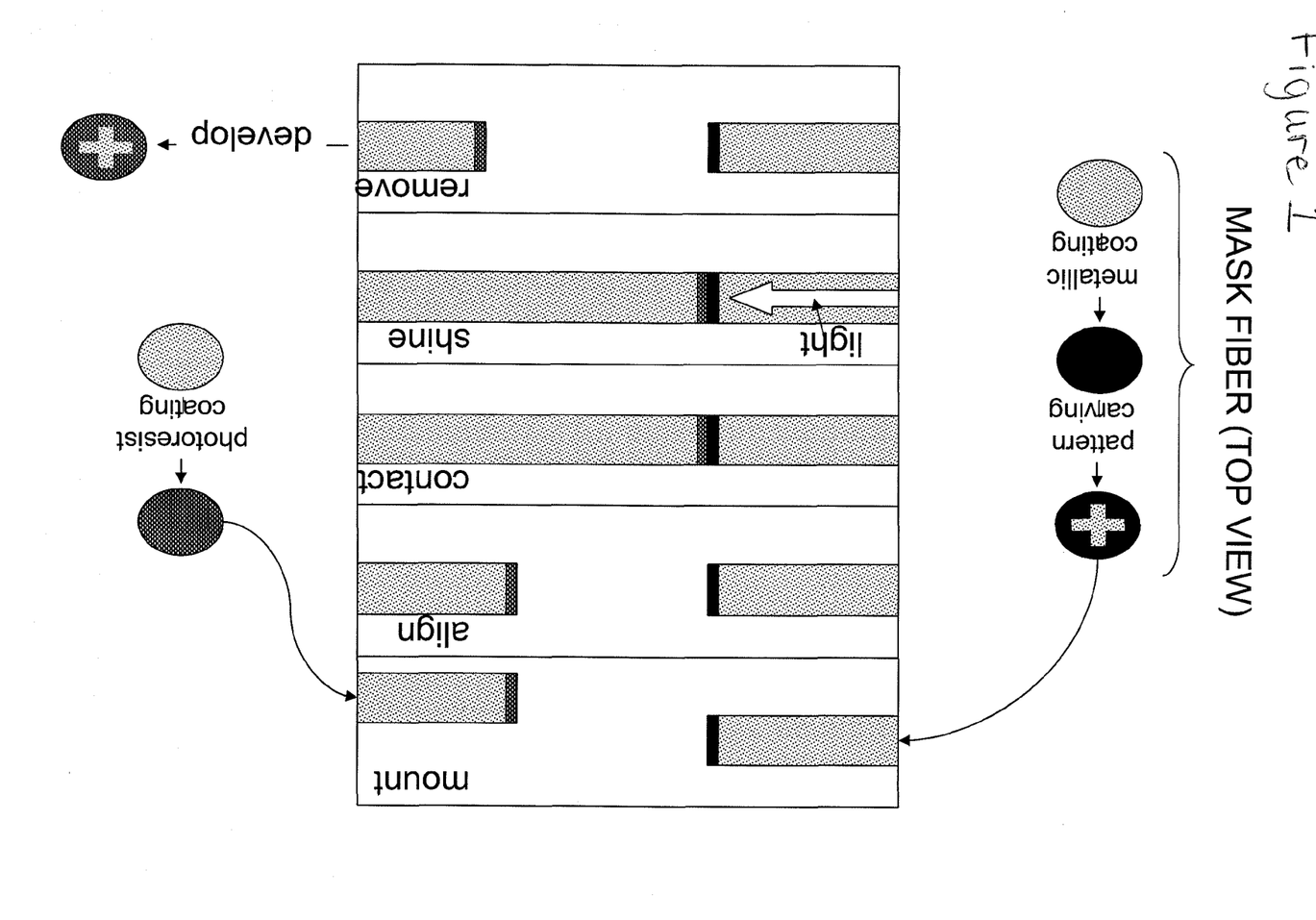
FIG. 1 shows a flow diagram of an exemplary embodiment of the align-and-shine photolithography procedure according to the present invention.

FIG. 1 shows a flow diagram of an exemplary embodiment of the align-and-shine photolithography procedure according to the present invention. For example, as shown on a left side of FIG. 1, a masked fiber could be an ultraviolet multimode fiber which can be first coated with a metallic layer, which metallic layer may then selectively be removed only along the pattern that must be reproduced on the target fiber. The target fiber (on a right side of FIG. 1) can be coated with photoresist. Thus, the lithography shadow mask can be fabricated directly on the cleaved end of the ultraviolet multimode fiber (e.g., the mask fiber), which may be aligned with another fiber coated with photoresist (e.g., the target fiber). Such two fibers may be mounted on an optical splicing machine, where they can be aligned and brought to contact. The pattern may be transferred from the mask fiber to the target fiber by shining, e.g., an ultraviolet light from the opposite side of the mask fiber. The target fiber can then be immersed in a developing solution, where the parts of the photoresist exposed to light may be washed away, as in standard photolithography techniques (G. T. A. Kovacs, Micromachined transducers sourcebook (McGraw-Hill, New York, 1998).). The alignment and the movement to contact can for instance be performed using exemplary image-based active fiber alignment processes used in commercially available optical fiber splicing machine (A. D. Yablon, Optical fiber fusion splicing (Springer, Berlin, 2005)) or similar opto-mechanical automatic alignment processes. Such exemplary procedures can thus facilitate a transfer of the pattern provided on the mask to a large number of other fibers in a sequence of steps that can be utilized in a series production.

To demonstrate the feasibility of the align-and-shine technique, according to an exemplary embodiment of the present invention, it is possible to first fabricate a mask fiber. For example, a 230 µm diameter ultraviolet multimode fiber (e.g., Newport F-MBB) can be coated with a 100 nm silver layer and mounted inside a focused ion beam (FIB) milling machine, which can be used to remove the metallic layer along the pattern that we intended to transfer to other fibers (e.g., a cross). The mask can be fabricated also with other methods, such as, but not limited to, laser ablation.

Figure 2:
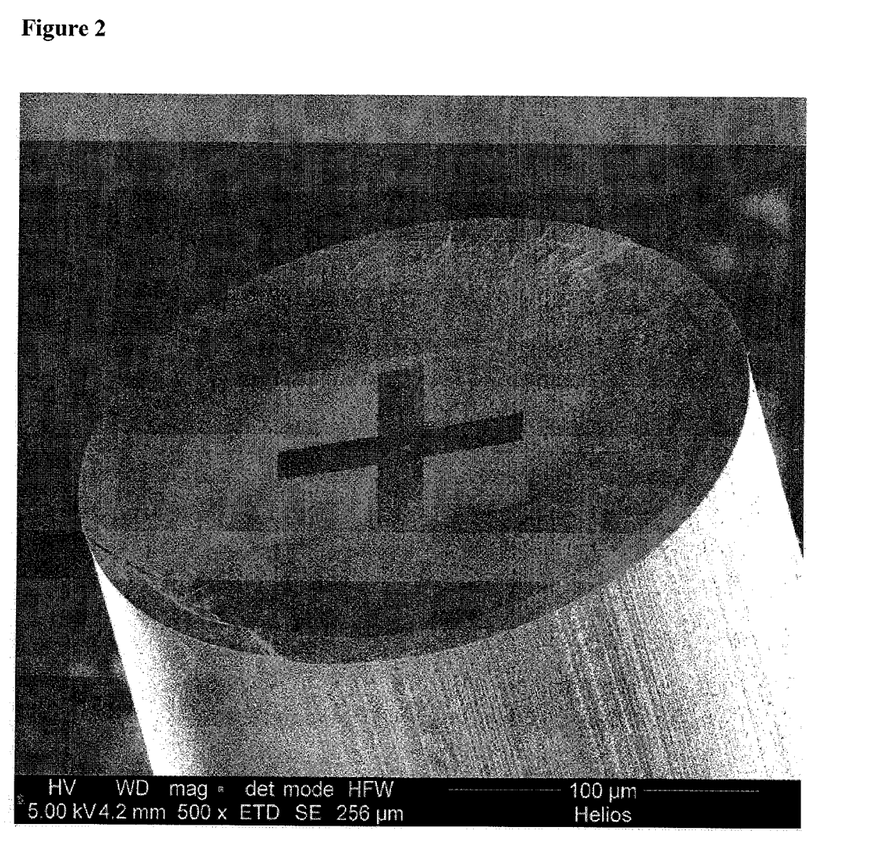
FIG. 2 shows prospective view of an exemplary focused ion beam image of the masked optical fiber used to demonstrate the feasibility of the align-and-shine photolithography process.

For example, FIG. 2 shows prospective view of an exemplary focused ion beam image of the mask fiber used to demonstrate the feasibility of the align-and-shine photolithography process. The facet of such illustrated fiber can be coated with a silver layer, e.g., everywhere except from the central cross, where metal is removed with focused ion beam milling.

As shown in FIG. 2, in particular, an FIB image of the fiber can be obtained as it may appear at the end of the exemplary milling procedure, just before such fiber is removed from the FIB machine and mounted on one of the two holders of an optical fiber fusion splicing machine (e.g., Ericsson FSU 905). On the opposite holder, it is possible to mount the target fiber for example a 125 µm diameter single mode fiber (e.g., Corning SM 128) coated with photoresist (e.g., Micro Resist Technology ma-P 1205). The coating can be deposited by dipping the fiber in a solution of acetone and photoresist. The fiber may be then left in air at room temperature for ~15 minutes to let acetone slowly evaporate, and then backed for 5 minutes at 60 C and for 3 minutes at 100 C to cure/harden the photoresist.). The two fibers can then be aligned and brought to contact using the mechanical controls of the splicing machine. Upon contact, the light of an ultraviolet lamp (e.g., Norland Opticure 4) may be coupled from the opposite side of the mask fiber for ~20 s. After exposure, the photoresist may be developed according to standard lithography procedures. The result of this exemplary process is shown in FIG. 3.

Figure 3:
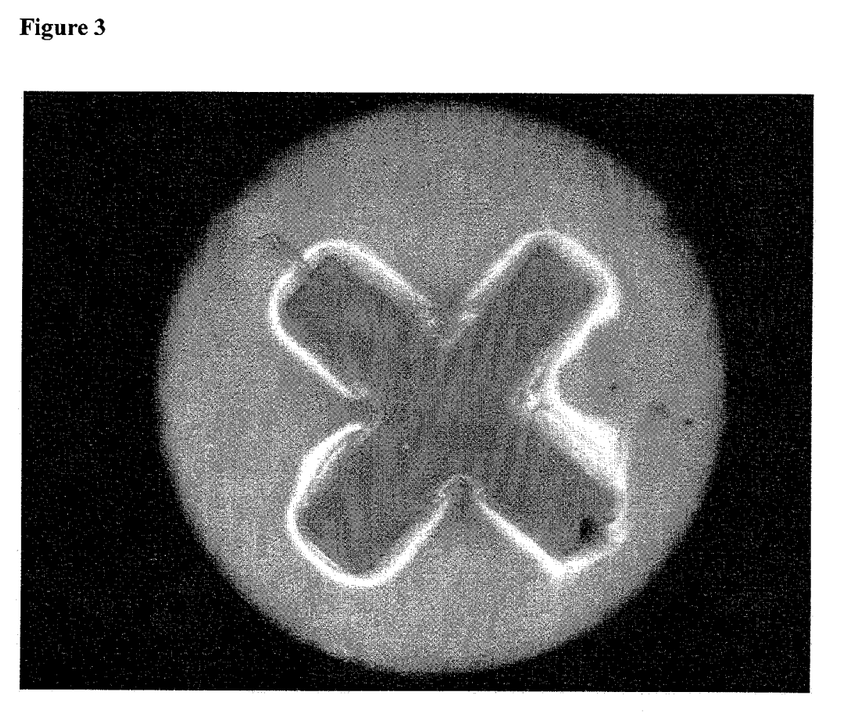
FIG. 3 shows an exemplary cross sectional optical microscope image of a photoresist pattern on top of the target fiber.

In particular, FIG. 3 shows an exemplary cross sectional optical microscope image of a photoresist pattern on top of the target fiber, e.g., at the conclusion of the exemplary align-and-shine photolithography process according to the present invention. For example, the diameter of this illustrated fiber can be about 125 µm, while the diameter of the mask fiber may be 230 µm. In particular, the pattern of the mask fiber has been successfully transferred to the target fiber. Thus, the exemplary embodiment of the align-and-shine system and method can facilitate a transfer of the pattern of the mask to the target fiber. Similar results can be obtained when the exemplary process is repeated with the same mask fiber on other target fibers.

Accordingly, exemplary embodiments of the system and method for facilitating the series production of arbitrary photolithography patterns on optical fibers according to the present invention has been described herein above. It is within the scope of the present invention to use the exemplary principles described herein also for photo or thermoplastic nanoimprinting lithography (S. Y. Chou, P. R. Krauss, and P. J. Renstrom, Imprint of sub −25 nm vias and trenches in polymers, Appl. Phys. Lett. 67, 3114-3116 (1995); M. Colburn et al., Step and flash imprint lithography: a new approach to high-resolution patterning, Proc. SPIE 3676(1), 379-390 (1999); X. Cheng and L. J. Guo, A combined-nanoimprint-and-photolithography patterning technique, Microel. Eng. 71, 277-282 (2004).), where a mold fiber (i.e., a fiber with a carved pattern on one of its cleaved ends) can be pressed against the target fiber, previously coated with a proper layer.

FIG. 4a-4e shows the method applying patterns on a target fiber having optical functionality.

Figure 4A:
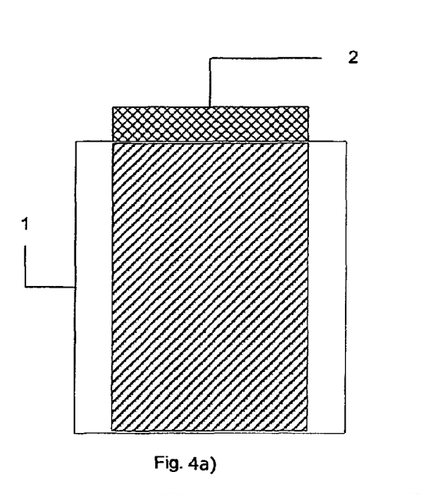
FIG. 4a-4e shows the method applying patterns on a target fiber with different functionalities.
Figure 4B:
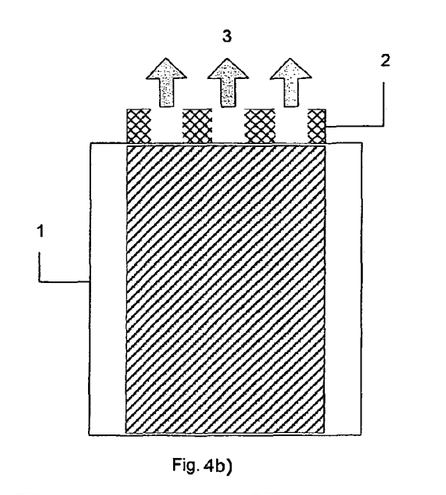
Figures 4C, 4D:
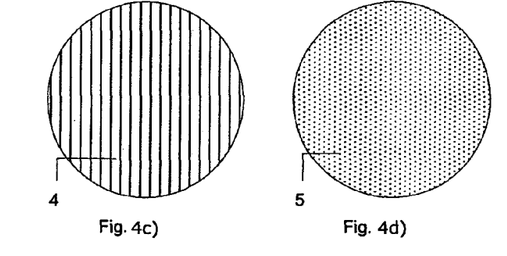
Figure 4E:
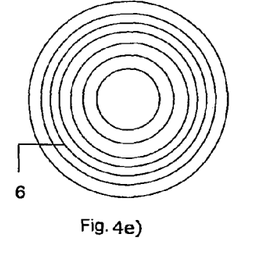

FIG. 4a shows the distal end of an optical fiber 1, provided with a mask material 2, for instance silver. Using conventional methods like the ones described above, a pattern 3 is obtained by selective removal of the mask material 2. The pattern 3 as shown in FIG. 4b provides an aperture which allows the passage of UV radiation from the fiber 1, in order to treat positive or negative photoresist material deposited on a target surface. The pattern 3 is conveyed to the photoresist material, and may have various optical or other functionalities. For instance, FIG. 4c shows an optical grating structure 4. FIG. 4d shows an array of microantennae 5, appearing like a dotted pattern when shown from above. FIG. 4e shows a Fresnel lens pattern 6.

Figure 5A:
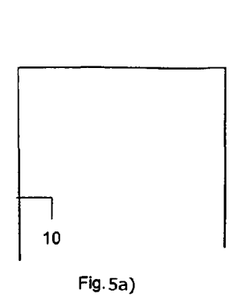
FIGS. 5a)-5l) show the use of the method according to the invention using protective layers, structural layers, and sacrificial layers in the construction of complex three dimensional elements on top of an optical fiber.
Figure 5B:
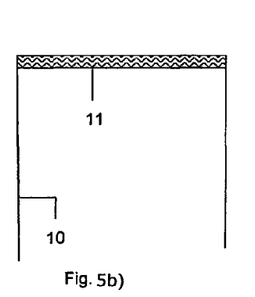
Figure 5C:
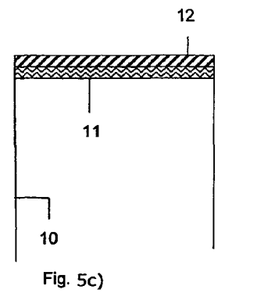
Figure 5D:
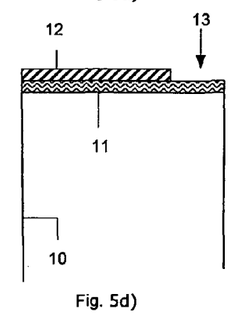
Figure 5E:
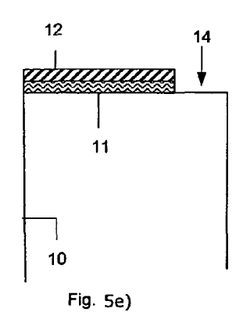
Figure 5F:
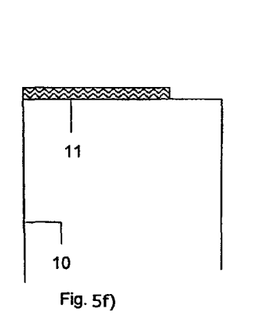
Figure 5G:
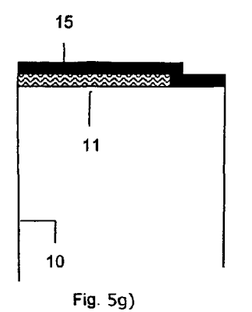
Figure 5H:
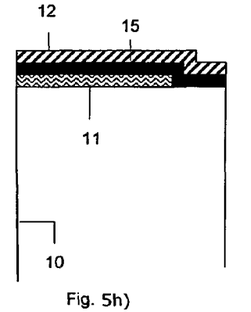
Figure 5I:
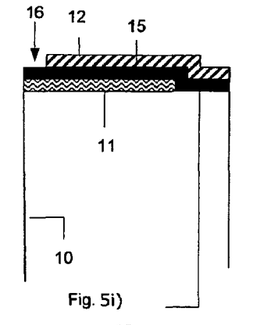
Figure 5J:
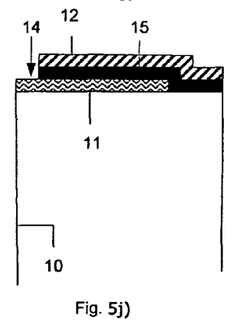
Figure 5K:
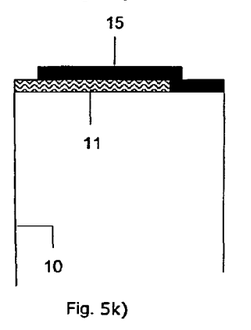
Figure 5L:
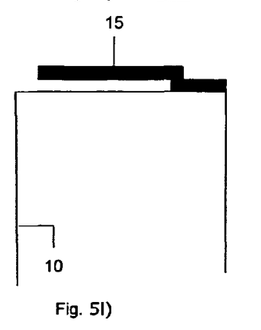

FIGS. 5a)-5l) show the use of the method according to the invention using protective layers, structural layers, and sacrificial layers in the construction of complex three dimensional elements on top of an optical fiber. In this example a cantilever structure is constructed, which may be used in various sensor applications. The subsequent steps in the figures show only one application, many other three-dimensional elements may be constructed using the technical principles of the invention. It is understood the method according to the invention may be applied to various target surfaces, and is not restricted to the construction of three dimensional elements on distal ends of fibers.

FIG. 5a shows a distal end of an optical fiber 10, obtained for instance by cleaving/splicing. In FIG. 5b, a sacrificial material, for instance phosphosilicate glass, is deposited on top of the surface of the fiber end 10. Subsequently, a first layer of photoresist protective material is applied (FIG. 5c), which by using the align-and shine method according to the invention is selectively irradiated in a pattern 13 which only partially exposes the underlying sacrificial material. In FIG. 5e, exposed parts of the sacrificial material 11 are removed by etching 14, inducing the predetermined pattern of the protective layer 12 onto the sacrificial material 11. Parts of the sacrificial layer 11 shielded from etching by the photoresist protective layer remain. The temporary protective layer 12 is removed, for instance by a solvent, and subsequently a first layer of actual structural material 15 (for example silicon nitride) is applied, for instance by vapor deposition techniques, following the shape of the exposed surfaces of the fiber 10 and the sacrificial layer 11 (FIG. 5g). After the construction step, another layer of protective photoresist material 12 is applied (FIG. 5h), which again is selectively irradiated by the align-and-shine method according to the invention, and redundant photoresist material is removed to obtain a second pattern 16 which partially exposes the structural material layer 15 (FIG. 5i). Etching 14 results in selective removal of structural material 15 and optionally also part of the underlying sacrificial material (depending on the etching intensity and duration), forming the pattern according to the second protective layer 12 in the structural material (FIG. 5j). The protective layer 12 is removed to yield a shaped layer of structural material 15 partially supported by the sacrificial material 11 (FIG. 5k). The sacrificial material 11 is finally removed to yield a three dimensional structure disposed at the distal end of the fiber 10, in this case the cantilever structure shown in FIG. 5l.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. In addition, to the extent that the prior art knowledge has not been explicitly incorporated by reference herein above, it is explicitly being incorporated herein in its entirety. All publications referenced herein above are incorporated herein by reference in their entireties.

The invention claimed is;

1. A method for applying a predetermined pattern to a distal end of a target optical fiber comprising the steps of:

providing a masked optical fiber, wherein a distal end of the masked optical fiber is provided with an optical mask having a predetermined pattern, applying a layer of photoresist material to at least part of the target fiber, aligning the distal end of the masked optical fiber with respect to the target fiber provided with photoresist material, applying irradiation through the masked optical fiber to apply the predetermined pattern in at least part of the photoresist material on the target fiber, thereby providing a pattern onto the target fiber, the pattern having substantially the same shape as the predetermined pattern, and removing soluble photoresist material with a solvent, wherein, when the photoresist material is a positive photoresist material, the soluble photoresist material is photoresist material exposed to the irradiation, and when the photoresist material is a negative photoresist material, the soluble photoresist material is photoresist material not exposed to the irradiation.

2. An optical fiber obtainable by the method according to claim 1, wherein the distal end of the target optical fiber is provided with a predetermined pattern made of a photoresist material.

3. A method according to claim 1 for the layerwise construction of a three dimensional structure on a target fiber, wherein the steps are applied to provide at least one protective pattern made of photoresist material for use in layer deposition and removal techniques.

4. An optical fiber obtainable by the method according to claim 3, wherein the distal end of the target optical fiber is provided with a three-dimensional structure.

5. The optical fiber according to claim 4, wherein the three-dimensional structure is a cantilever structure.

6. The method according to claim 1, wherein the step of providing a masked optical fiber further comprises:
providing a distal end of an optical fiber with a substantially flat perpendicular surface, and
applying a mask material on the distal end to form the optical mask having the predetermined pattern.

7. The method according to claim 6 wherein the mask material is applied on the substantially flat perpendicular surface to form the optical mask having the predetermined pattern.

8. The method according to claim 6, wherein the predetermined pattern is obtained by selective removal of the mask material.

9. The method according to claim 6, wherein the predetermined pattern is provided inside a circumference of the distal end of the masked optical fiber.

10. The method according to claim 6, wherein the predetermined pattern is provided inside an outer boundary of the substantially flat perpendicular surface.

11. The method according to claim 6, wherein the predetermined pattern is provided inside an outer boundary of the distal end of the masked optical fiber.

12. The method according to claim 6, wherein the predetermined pattern is at least partly provided in a central portion of the distal end of the optical fiber.

13. The method according to claim 1, wherein the predetermined pattern is provided inside a circumference of the distal end of the masked optical fiber.

14. The method according to claim 1, wherein the predetermined pattern is provided inside an outer boundary of the distal end of the masked optical fiber.

15. The method according to claim 1, wherein the predetermined pattern is at least partly provided in a central portion of the distal end of the optical fiber.

* * * * *